(12) United States Patent
Miyazaki et al.

(10) Patent No.: US 9,024,620 B2
(45) Date of Patent: May 5, 2015

(54) POLARITY DETECTION CIRCUIT

(75) Inventors: Masatsuru Miyazaki, Tokyo (JP);
Hidetaka Yoshihashi, Tokyo (JP)

(73) Assignee: FDK Corporation, Tokyo (JP)

( * ) Notice: Subject to any disclaimer, the term of this patent is extended or adjusted under 35 U.S.C. 154(b) by 119 days.

(21) Appl. No.: 13/979,715

(22) PCT Filed: Jan. 11, 2012

(86) PCT No.: PCT/JP2012/050380
§ 371 (c)(1),
(2), (4) Date: Aug. 7, 2013

(87) PCT Pub. No.: WO2012/102081
PCT Pub. Date: Aug. 2, 2012

(65) Prior Publication Data
US 2013/0314072 A1    Nov. 28, 2013

(30) Foreign Application Priority Data
Jan. 27, 2011  (JP) .................................. 2011-15469

(51) Int. Cl.
*G01R 25/00*     (2006.01)
*G01R 19/14*     (2006.01)

(52) U.S. Cl.
CPC ............... *G01R 25/00* (2013.01); *G01R 19/14* (2013.01)

(58) Field of Classification Search
CPC ........ G01R 19/14; G01R 25/00; H02J 7/0034
See application file for complete search history.

(56) References Cited

U.S. PATENT DOCUMENTS

| 4,241,373 A * | 12/1980 | Mara et al. ..................... 361/92 |
| 4,278,937 A * | 7/1981 | Immler .......................... 324/86 |
| 5,289,166 A * | 2/1994 | Cohen ........................... 340/661 |
| 5,557,220 A   | 9/1996 | Araya et al. |
| 2013/0077365 A1 * | 3/2013 | Chalermboon et al. ........ 363/89 |

FOREIGN PATENT DOCUMENTS

| JP | S52-151770 | 5/1976 |
| JP | H5-64432 | 3/1993 |
| JP | H7-55851 | 3/1995 |

OTHER PUBLICATIONS

First Office Action, Chinese Patent Application No. 201280006748.1, Oct. 20, 2014.
International Search Report and Written Opinion of the ISA for PCT/JP2012/050380, ISA/JP, mailed Apr. 24, 2012.

* cited by examiner

*Primary Examiner* — Jeff Natalini
(74) *Attorney, Agent, or Firm* — Harness, Dickey & Pierce, P.L.C.

(57) ABSTRACT

The polarity detection circuit includes a first diode with anode receiving a first phase of the AC power supply voltage and a second diode with anode receiving a second phase, opposite the first phase. The detection circuit further includes a constant-voltage power supply outputting a positive constant voltage. A first reference-voltage output circuit outputs a voltage corresponding to the constant voltage when the AC voltage of the first phase is positive, and outputs a voltage at a cathode of the second diode when the AC voltage of the first phase is negative. The detection circuit also includes a first signal output circuit that compares a first voltage, corresponding to a voltage at the cathode of the first diode, and a voltage output from the first reference-voltage output circuit and that outputs a signal indicative of polarity of the AC voltage having the first phase according to a comparison result.

4 Claims, 11 Drawing Sheets

POLARITY DETECTION CIRCUIT

CROSS REFERENCE TO RELATED APPLICATIONS

This application is a 371 U.S. National Stage of International Application No. PCT/JP2012/050380, filed Jan. 11, 2012. This application claims priority to Japanese Patent Application No. 2011-15469, filed Jan. 27, 2011. The disclosures of the above applications are entirely incorporated by reference herein.

TECHNICAL FIELD

The present invention relates to a polarity detection circuit.

BACKGROUND ART

Today, as a power supply device configured to convert an alternate-current voltage into a direct current voltage, switching power supply devices having excellent characteristics in miniaturization, weight reduction, and efficiency are widely used. Such a switching power supply device first converts an alternate-current voltage into a direct current voltage, and thereafter raises or lowers the voltage so as to reach the voltage required for driving a load.

With respect to such a switching power supply device, various techniques have been developed in order to propel stabilization of an output voltage, improvement in efficiency, miniaturization and the like (see, for example, Patent Literature 1).

CITATION LIST

Patent Literature

[Patent Literature1] Japanese Patent Application Laid-open Publication No. Hei5-64432

SUMMARY OF INVENTION

Technical Problem

In such a switching power supply device (hereinafter, also referred to as a switching power supply circuit), in order to perform control in accordance with the polarity of the alternate-current voltage, a polarity detection circuit is widely used, which detects the polarity of the alternate-current voltage and output a signal indicative of the detected polarity.

FIG. 8 illustrates an example of such a switching power supply circuit. A switching power supply circuit 300 illustrated in FIG. 8 includes a rectifier circuit 400, a voltage converter circuit 500, and a polarity detection circuit 600.

The rectifier circuit 400 is a circuit configured to convert an alternate-current voltage between a terminal L and a terminal N of an alternating-current power supply 100 into a direct current voltage. The voltage converter circuit 500 is a circuit configured to raise or lower the direct current voltage, which is outputted from the rectifier circuit 400, to the predetermined voltage, which is determined according to a load 200. The polarity detection circuit 600 is a circuit configured to detect the polarity of the alternate-current voltage from the alternating-current power supply 100, which is applied to the switching power supply circuit 300, and output various control signals for controlling the rectifier circuit 400 in accordance with the polarity.

First, FIG. 9 illustrates a configuration example of the rectifier circuit 400. The rectifier circuit 400 illustrated in FIG. 9 is a synchronous rectifier circuit including four transistors Tr1 to Tr4 (401-404) and a capacitor C1 (405).

The rectifier circuit 400 turns on the transistors Tr1 (401) and Tr4 (404) and turns off the transistors Tr2 (402) and Tr3 (403), when a voltage on the terminal L side of the alternating-current power supply 100 is higher than a voltage on the terminal N side thereof. This causes the rectifier circuit 400 to charge the capacitor C1 (405) with a current flowing from the terminal L of the alternating-current power supply 100 to the rectifier circuit 400.

In contrast, when a voltage on the terminal N side of the alternating-current power supply 100 is higher than a voltage on the terminal L side thereof, the rectifier circuit 400 turns off the transistors Tr1 (401) and Tr4 (404) and turns on the transistors Tr2 (402) and Tr1 (403). This causes the rectifier circuit 400 to charge the capacitor C1 (405) with a current flowing from the terminal N of the alternating-current power supply 100 to the rectifier circuit 400.

As such, the rectifier circuit 400 outputs a direct current voltage with the capacitor C1 (405) being charged.

Next, FIG. 10 illustrates a configuration example of the voltage converter circuit 500. The voltage converter circuit 500 illustrated in FIG. 10 is a chopper boost converter including a coil L (503), a transistor Tr5 (501), a diode D3 (502), and a capacitor C2 (504).

The voltage converter circuit 500 performs switching of the transistor Tr5 (501) with a control signal having the predetermined frequency and the predetermined duty cycle, thereby raising a voltage applied to the voltage converter circuit 500 to the predetermined voltage, and outputting the voltage.

Next, FIG. 11 illustrates a configuration example of the polarity detection circuit 600. The polarity detection circuit 600 illustrated in FIG. 11 includes diode D11 and D12 (602, 606), resistors R11 to R14 (603, 604, 607, 608), a constant-voltage power supply DC (609), and two comparators 601 and 602.

A non-inverting input terminal of the comparator 601 is applied with a voltage obtained by half-wave rectifying the voltage outputted from the terminal L of the alternating-current power supply 100 by the diode D11 (602) and thereafter voltage-dividing such a voltage by the resistors R11 (603) and R14 (604). An inverting input terminal of the comparator 601 is applied with a voltage from the constant-voltage power supply DC (609).

In such a case, when the voltage on the terminal L side of the alternating-current power supply 100 is increased and the voltage at the non-inverting input terminal of the comparator 601 exceeds the voltage of the constant-voltage power supply DC (609), the comparator 601 outputs a control signal (control signal A) of one logic level (e.g., Hi) from a terminal A (hereinafter, also referred to as "output the control signal A).

In contrast, when the voltage on the terminal L side of the alternating-current power supply 100 is decreased and the voltage at the non-inverting input terminal of the comparator 601 falls below the constant-voltage power supply DC (609), the comparator 601 changes the logic level of the control signal A to the other logic level (e.g., Lo) and outputs the signal (hereinafter, also referred to as "stop outputting the control signal A).

The comparator 605, similarly to the comparator 601, outputs or stops outputting a control signal (hereinafter, also referred to as a control signal B) from a terminal B according to the voltage on the terminal N side of the alternating-current power supply 100.

In the polarity detection circuit 600 illustrated in FIG. 11, the inverting input terminals of both of the comparators 601 and 605 are connected to the constant-voltage power supply DC (609), and the control signals A and B are caused not to be outputted unless a voltage at the non-inverting input terminal exceeds a voltage value of the constant-voltage power supply DC (609). This prevents the control signal A and the control signal B from being concurrently outputted from the two comparator 601 and 605 in the case where the magnitude relationship is reversed between the voltage on the terminal L side and the voltage on the terminal N side of the alternating-current power supply 100, and the like.

As described above, the polarity detection circuit 600 outputs either of the control signal A and the control signal B in an alternate manner in accordance with the polarity of the alternate-current voltage outputted from the alternating-current power supply 100. Then, the control signal A is applied to the gate terminals of the transistors Tr1 and Tr4 (401, 404) of the rectifier circuit 400, and the control signal B is applied to the gate terminals of the transistors Tr2 and Tr1 (402, 403), which causes the rectifier circuit 400 to rectify the aforementioned alternate-current voltage to a direct current voltage.

However, for example, if lightning, failure of external electric power supply equipment, or the like occurs, both of the voltages on the terminal L side and the terminal N side of the alternating-current power supply 100 may greatly rise. In such a case, a voltage applied to the non-inverting input terminal of one of the comparator 601 and the comparator 605, to which a negative voltage is originally outputted from the alternating-current power supply 100, out of the two comparator 601 and 605, exceeds a voltage from the constant-voltage power supply DC (609). Thus, there is a possibility that the control signal A or the control signal B, which originally should not be outputted, is outputted.

Alternatively, as illustrated in FIG. 11, in the case where electric charge is accumulated in a noise reduction capacitor 101, referred to as X-cap, which is provided in the alternating-current power supply 100, and when the switching power supply circuit 300 is connected to the alternating-current power supply 100, a voltage applied to the non-inverting input terminal of the comparator 601 or the comparator 605, to which a negative voltage is originally outputted from the alternating-current power supply 100, exceeds a voltage from the constant-voltage power supply DC (609), due to the electric charge discharged from the capacitor 101. Thus, there is a possibility that the control signal A or the control signal B, which originally should not be outputted, is outputted.

In these cases, the control signal A and the control signal B are concurrently outputted from the two comparators 601 and 605. Then, the internal circuit of the rectifier circuit 400 is short-circuited, and there is a possibility that the rectifier circuit 400 or the switching power supply circuit 300 is broken down.

Thus, in the polarity detection circuit configured to output a signal corresponding to the polarity of the alternate-current voltage outputted from the alternating-current power supply, such a technique is required as not to erroneously output a signal indicative of the polarity.

The present invention has been made in view of such a problem, and an object thereof is to provide a polarity detection circuit configured not to erroneously output a signal indicative of polarity of an alternate-current voltage in the polarity detection circuit configured to detect the polarity and output a signal corresponding to the polarity.

Solution to Problem

One solution to the above described problem is a polarity detection circuit configured to output a signal indicative of polarity of an alternate-current voltage outputted from an alternating-current power supply, the polarity detection circuit including: a first diode having an anode to which an alternate-current voltage having a first phase is applied, the alternate-current voltage outputted from the alternating-current power supply; a second diode having an anode to which an alternate-current voltage having a second phase opposite to the first phase is applied, the alternate-current voltage outputted from the alternating-current power supply; a constant-voltage power supply configured to output a positive constant voltage; a first reference-voltage output circuit configured to, when the alternate-current voltage having the first phase is positive, output a voltage corresponding to the constant voltage, and, when the alternate-current voltage having the first phase is negative, output a voltage corresponding to a voltage at a cathode of the second diode; and a first signal output circuit configured to compare a first voltage corresponding to a voltage at a cathode of the first diode and a voltage outputted from the first reference-voltage output circuit, and output a signal indicative of polarity of the alternate-current voltage having the first phase, according to a comparison result.

Furthermore, a problem disclosed in the present application and a method for solving it will become clear from the description of embodiments and the drawings and the like.

Advantageous Effects of Invention

According to the present invention, it is possible not to erroneously output a signal indicative of polarity of an alternate-current voltage in a polarity detection circuit configured to detect the polarity and output a signal corresponding to the polarity.

BRIEF DESCRIPTION OF DRAWINGS

FIG. 1 is a diagram illustrating a configuration example of a switching power supply circuit according to an embodiment of the present invention.

FIG. 2 is a diagram illustrating a configuration example of a polarity detection circuit according to an embodiment of the present invention.

FIG. 3 is a diagram illustrating an operation of the polarity detection circuit according to an embodiment of the present invention.

FIG. 4 is a diagram for explaining an operation of the polarity detection circuit according to an embodiment of the present invention.

FIG. 5 is a diagram illustrating a configuration example of a switching power supply circuit according to an embodiment of the present invention.

FIG. 6 is a diagram illustrating a configuration example of a synchronous rectifier circuit according to an embodiment of the present invention.

FIG. 7 is a diagram illustrating a configuration example of a bridgeless boost circuit according to an embodiment of the present invention.

FIG. 8 is a diagram illustrating a configuration example of a switching power supply circuit according to an embodiment of the present invention.

FIG. 9 is a diagram illustrating a configuration example of a rectifier circuit according to an embodiment of the present invention.

FIG. 10 is a diagram illustrating a configuration example of a voltage converter circuit according to an embodiment of the present invention.

FIG. 11 is a diagram illustrating a configuration example of a polarity detection circuit according to an embodiment of the present invention.

DESCRIPTION OF EMBODIMENTS

Figure 1:
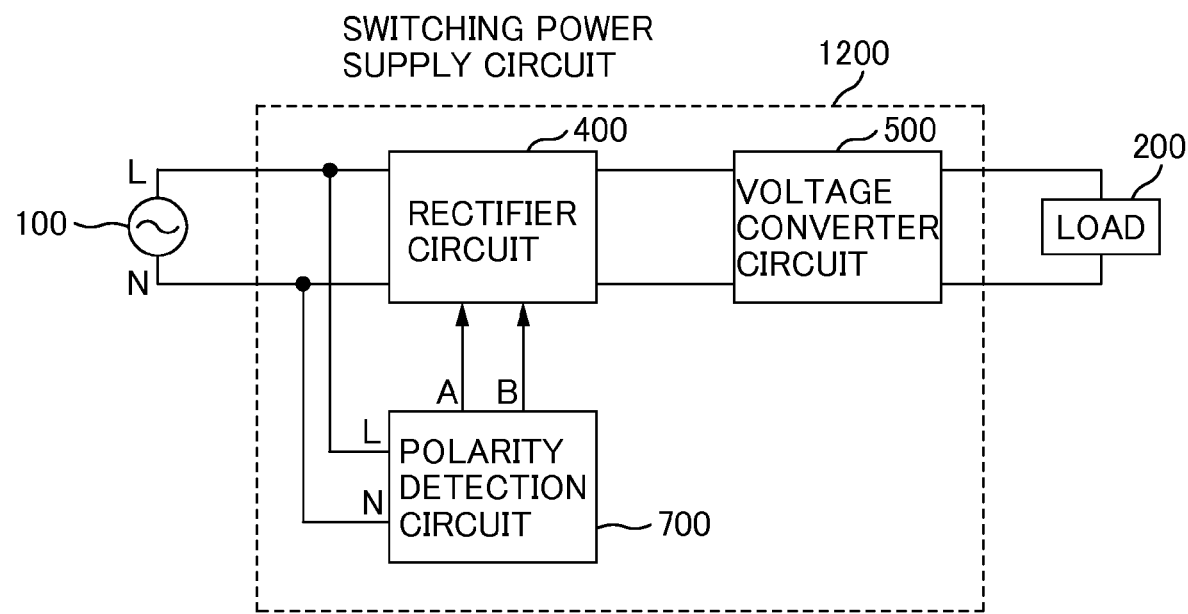
[FIG. 1]

FIG. 1 illustrates a configuration diagram of a switching power supply circuit 1200 including, as a component, a polarity detection circuit 700 according to a present embodiment.

The switching power supply circuit 1200 is a circuit configured to convert an alternate-current voltage outputted from an alternating-current power supply 100 into a predetermined direct current voltage corresponding to a load 200, and output the predetermined direct current voltage to the load 200.

The alternating-current power supply 100 can be, for example, a commercial 3-wire single-phase alternating-current power supply 100. The alternating-current power supply 100 illustrated in FIG. 1 has, for example, a terminal L (Live) from which an alternate-current voltage having the first phase is outputted, and a terminal N (Neutral) from which an alternate-current voltage having the second phase opposite in phase to the first phase is outputted. The alternate-current voltages having the first phase and the second phase are opposite in phase to each other, and thus, when one is positive, the other is negative, with respect to a voltage having a neutral phase of the alternating-current power supply 100, whereas when the other is positive, the one is negative, with respect thereto.

Off course, the alternating-current power supply 100 may be the one configured to output a single-phase alternate-current voltage that is generated combining alternate-current voltages having phases outputted from the polyphase (e.g., three-phase) alternating-current power supply 100.

The load 200 is electronic equipment configured to be operated with a direct current voltage. Various types of electronic equipment may be employed as the load 200, such as a computer, a digital camera, a cellular phone, a music player, and a game machine.

The switching power supply circuit 1200 includes a rectifier circuit 400, a voltage converter circuit 500, and the polarity detection circuit 700.

The rectifier circuit 400 is configured to convert an alternate-current voltage between the terminal L and the terminal N of the alternating-current power supply 100 into a direct current voltage. The rectifier circuit 400 may be, for example, a bridge rectifier circuit using a diode or a synchronous rectifier circuit using a switching element such as a transistor.

Figure 9:
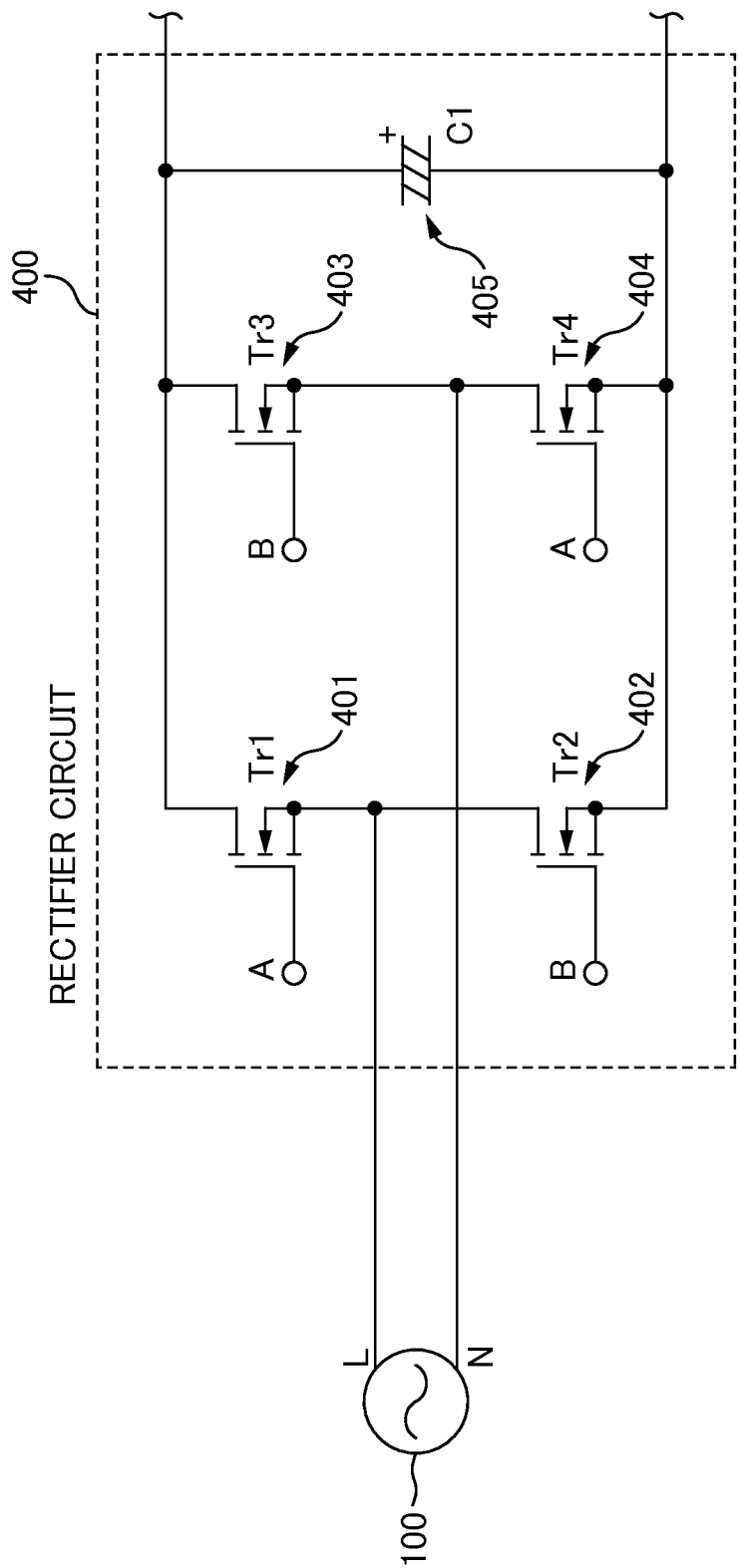
[FIG. 9]

FIG. 9 illustrates a configuration example of the rectifier circuit 400 according to the present embodiment. The rectifier circuit 400 illustrated in FIG. 9 is a synchronous rectifier circuit including four transistors Tr1 to Tr4 (401-404) and a capacitor C1 (405).

When a voltage on the terminal L side of the alternating-current power supply 100 is higher than a voltage on the terminal N side thereof, the rectifier circuit 400 turns on the transistors Tr1 (401) and Tr4 (404) and turns off the transistors Tr2 (402) and Tr1 (403). This causes the rectifier circuit 400 to charge the capacitor C1 (405) with a current flowing from the terminal L of the alternating-current power supply 100 into the rectifier circuit 400.

In contrast, when a voltage on the terminal N side of the alternating-current power supply 100 is higher than a voltage on the terminal L side thereof, the rectifier circuit 400 turns off the transistors Tr1 (401) and Tr4 (404) and turns on the transistors Tr2 (402) and Tr3 (403). This causes the rectifier circuit 400 to charge the capacitor C1 (405) with a current flowing from the terminal N of the alternating-current power supply 100 into the rectifier circuit 400.

The capacitor C1 (405) is charged as such, thereby outputting a direct current voltage from the rectifier circuit 400.

In order that this function of converting an alternate-current voltage into a direct current voltage with the rectifier circuit 400 shall effectively work, it is required to accurately detect the polarity of the alternate-current voltage outputted from the alternating-current power supply 100, and accurately perform switching of the transistors Tr1 to Tr4 (401-404) in accordance with the polarity.

Although will be described later in detail, the polarity detection circuit 700 according to the present embodiment is configured to output a control signal A when a voltage on the terminal L side is higher than a voltage on the terminal N side, and output a control signal B when a voltage on the terminal N side is higher than a voltage on the terminal L side, in accordance with the polarity of the alternate-current voltage outputted from the alternating-current power supply 100. Then, the control signal A is inputted to the transistors Tr1 (401) and Tr4 (404), and the control signal B is inputted to the transistors Tr2 (402) and Tr3 (403).

As such, switching of the transistors Tr1 to Tr4 (401-404) in the rectifier circuit 400 is appropriately performed in accordance with the polarity of the alternate-current voltage, thereby converting an alternate-current voltage into a direct current voltage in the rectifier circuit 400.

The voltage converter circuit 500 is configured to raise or lower the direct current voltage outputted from the rectifier circuit 400, to the predetermined voltage determined according to the load 200.

Figure 10:
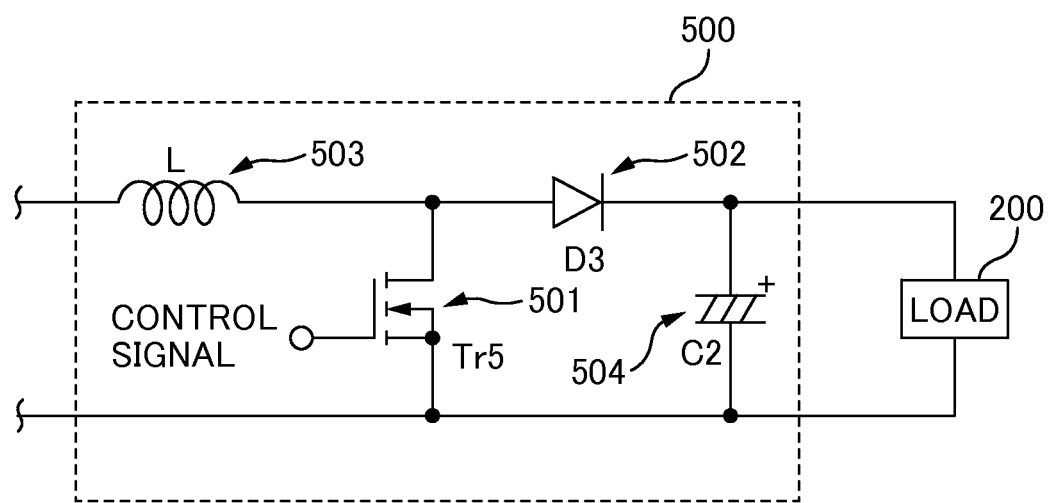
[FIG. 10]
Figure 11:
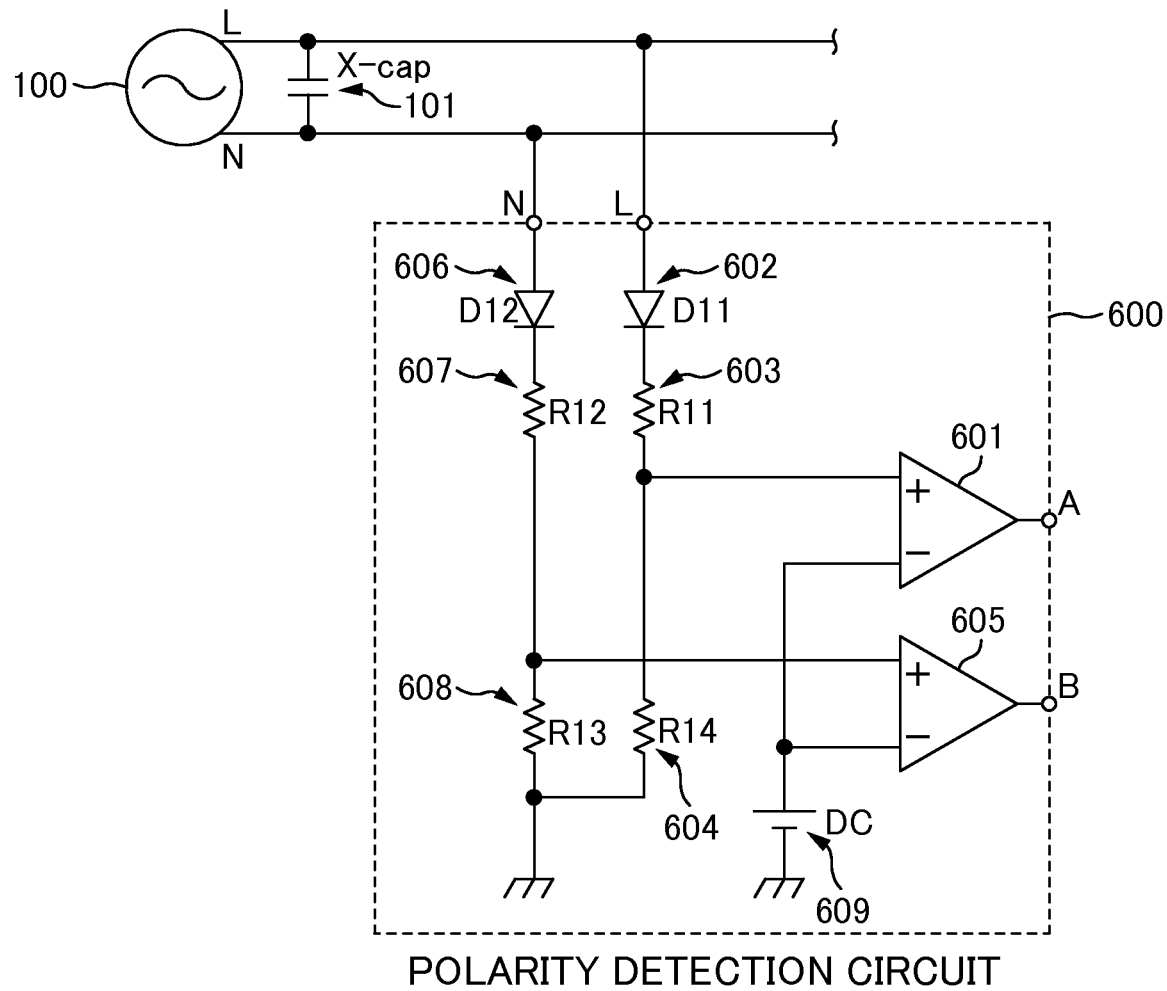
[FIG. 11]

FIG. 10 illustrates a configuration example of the voltage converter circuit 500. The voltage converter circuit 500 illustrated in FIG. 10 is a chopper boost converter including a coil L (503), a transistor Tr5 (501), a diode D3 (502), and a capacitor C2 (504).

The voltage converter circuit 500 is configured to perform switching of the transistor Tr5 (501) with a control signal having the predetermined frequency and the predetermined duty cycle, thereby raising a voltage applied to the voltage converter circuit 500 to the predetermined voltage, to be outputted therefrom.

The polarity detection circuit 700 is configured to detect the polarity of the alternate-current voltage from the alternating-current power supply 100, which is applied to the switching power supply circuit 1200, and output a signal indicative of the polarity.

Figure 2:
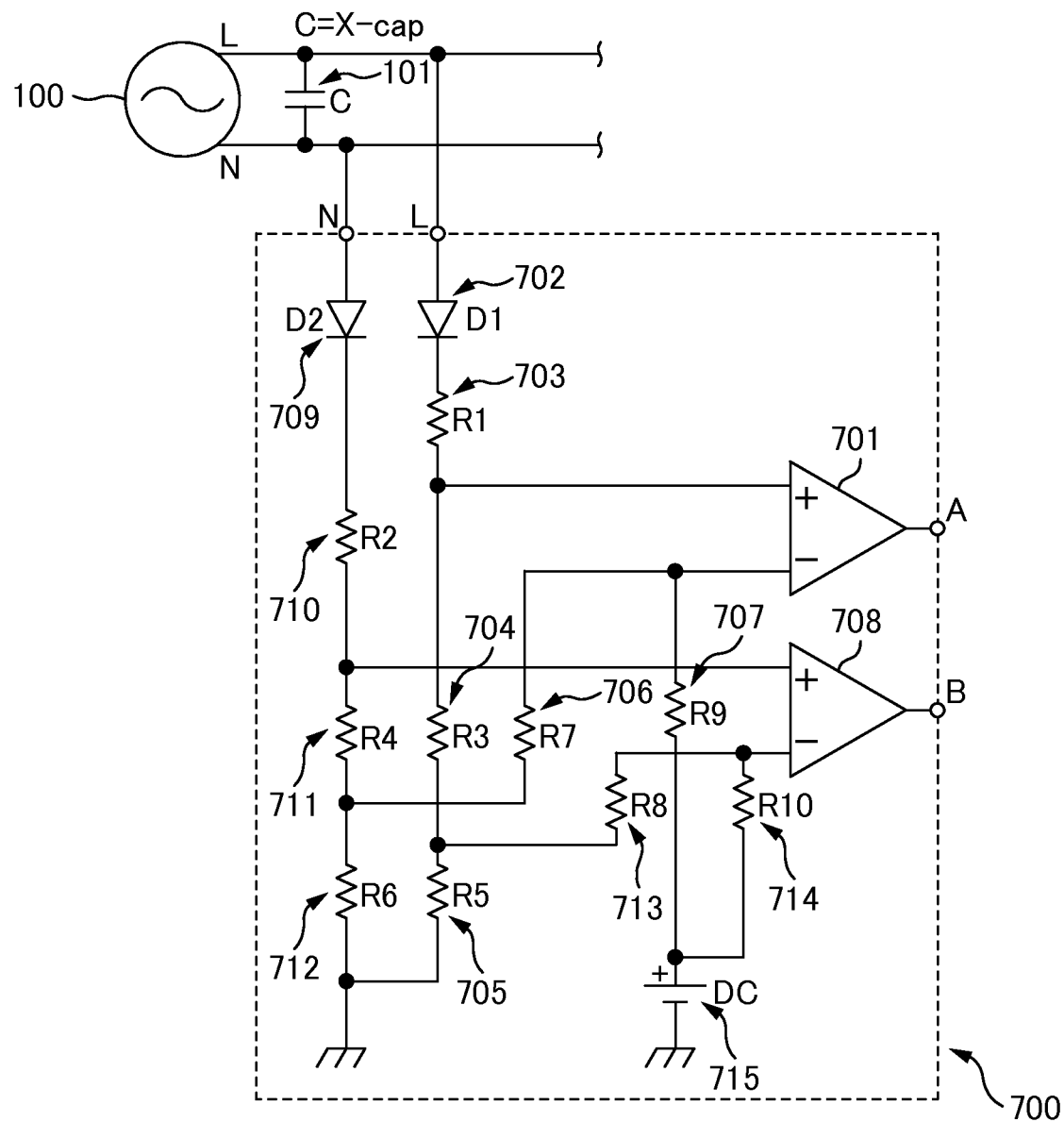
[FIG. 2]

FIG. 2 illustrates a configuration example of the polarity detection circuit 700 according to the present embodiment. The polarity detection circuit 700 illustrated in FIG. 2 includes a diode D1 (first diode) 703, a diode D2 (second diode) 709, resistors R1 to R10 (703-707, 710-714), and a constant-voltage power supply DC (715), and two comparators (first signal output circuit, second signal output circuit) 701, 708.

The polarity detection circuit 700 is configured to output the control signal A from the comparator 701 when a voltage on the terminal L side of the alternating-current power supply 100 is higher than a voltage on the terminal N side thereof, and output the control signal B from the comparator 708 when a voltage on the terminal N side is higher than a voltage on the terminal L side.

Figure 3:
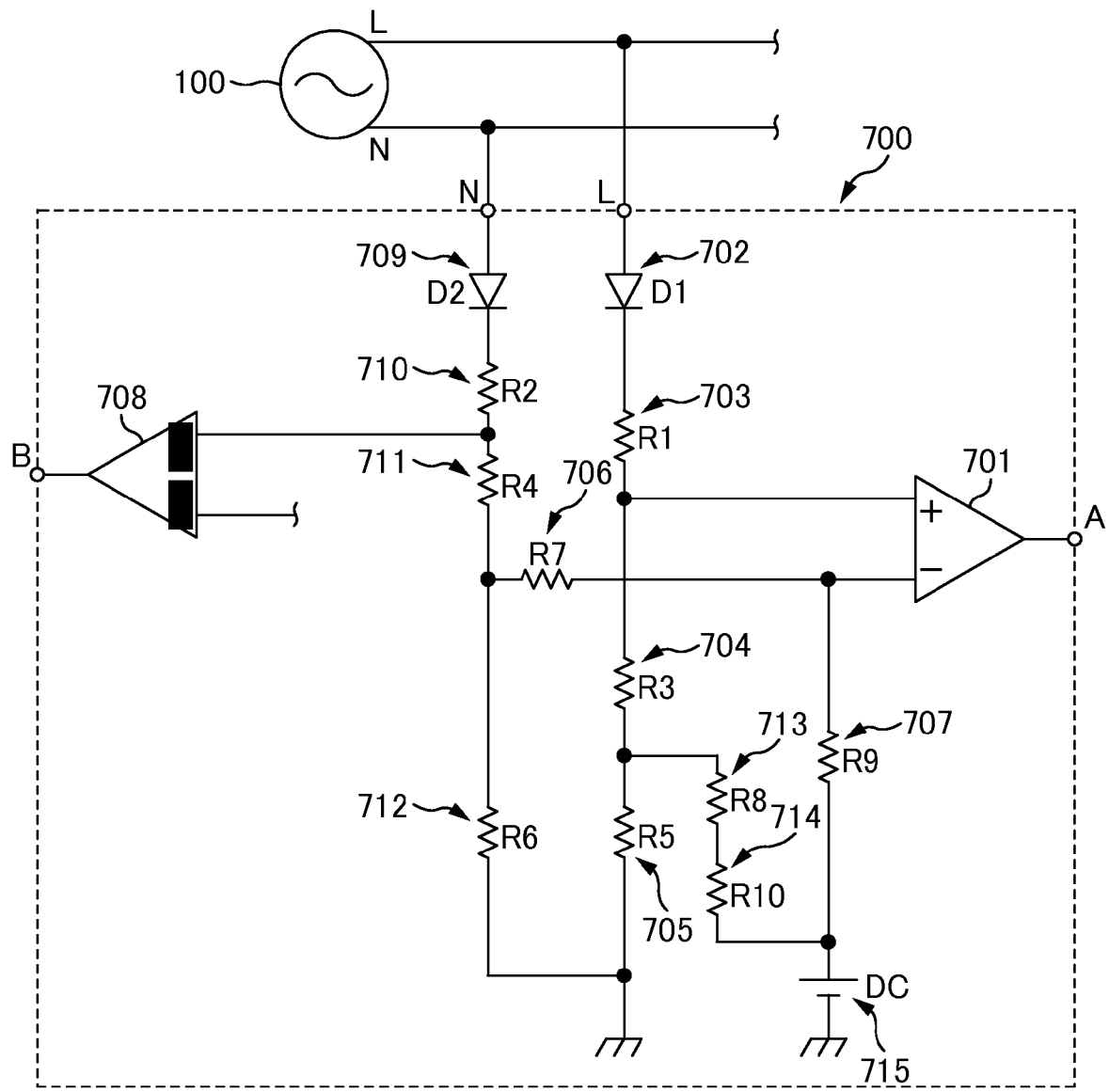
[FIG. 3]

Next, a description will be described of an operation of the polarity detection circuit 700 according to the present embodiment with reference to FIGS. 3 and 4. FIG. 3 is a diagram for explaining an operation when the control signal A is outputted from the comparator 701 in accordance with the polarity of the alternate-current voltage outputted from the alternating-current power supply 100. The operation when the control signal B is outputted from the comparator 708 is similar.

Figure 4:
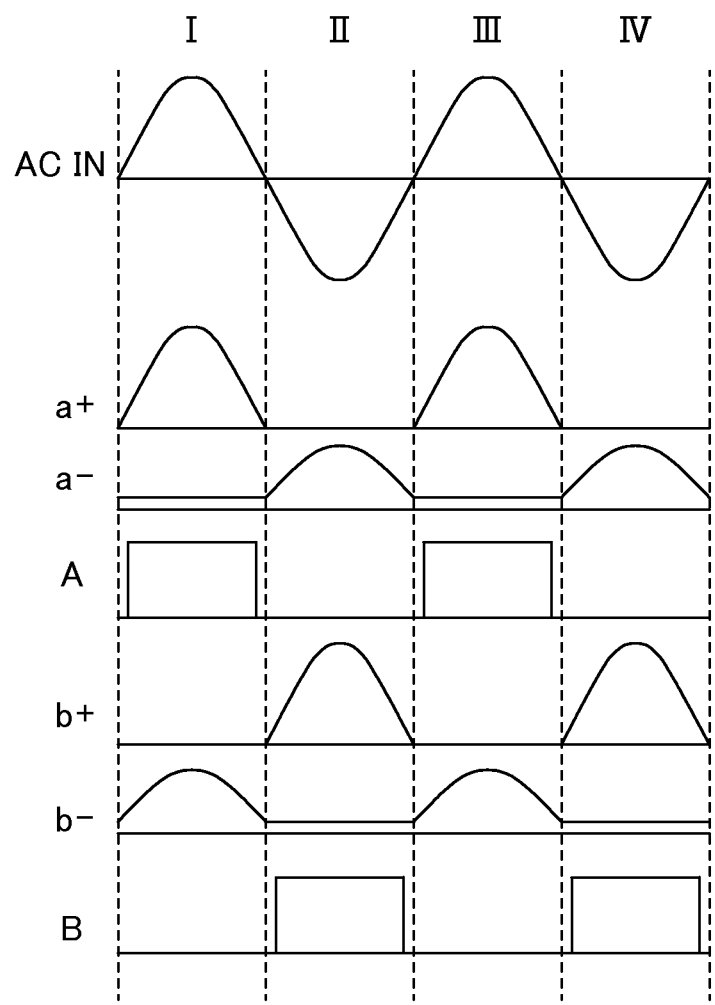
[FIG. 4]

Further, FIG. 4 is a diagram illustrating the waveforms of the voltages of the units in the polarity detection circuit 700. Note that, in FIG. 4, ACIN indicates a potential on the terminal L side with respect to a potential of the neutral phase of the alternating-current power supply 100. Further, a+ indicates a non-inverting input terminal of the comparator 701, a− indicates an inverting input terminal of the comparator 701, and A indicates an output terminal of the comparator 701. Further, b+ indicates a non-inverting input terminal of the comparator 708, b− indicates an inverting input terminal of the comparator 708, and B indicates an output terminal of the comparator 708.

As illustrated in FIG. 3, a terminal L of the polarity detection circuit 700 according to the present embodiment is connected to the terminal L of the alternating-current power supply 100, and a terminal N of the polarity detection circuit 700 is connected to the terminal N of the alternating-current power supply 100.

First, when a voltage applied to the terminal L of the polarity detection circuit 700 is positive, a positive voltage is applied to the anode of the diode D1 (702), and thus a voltage substantially equal to a voltage outputted from the terminal L of the alternating-current power supply 100 is outputted to the cathode of the diode D1 (702). Therefore, a voltage (first voltage) corresponding to a voltage at the cathode of the aforementioned diode D1 (702) is applied to the non-inverting input terminal (a+) of the comparator 701.

Specifically, a voltage at the cathode of the diode D1 (702) is divided by a circuit including the resistor R1 (703), the resistor R3 (704), the resistor R5 (705), the resistor R8 (713), the resistor R10 (714), and the constant-voltage power supply DC (715), thereby outputting the aforementioned first voltage and the first voltage is applied to the non-inverting input terminal (a+) of the comparator 701.

At this time, since a voltage applied to the terminal N of the polarity detection circuit 700 is negative, a negative voltage is applied to the anode of the diode D2 (709). Thus, a voltage (first reference voltage) corresponding to a constant voltage outputted from the constant-voltage power supply DC (715) is applied to the inverting input terminal (a−) of the comparator 701. Specifically, a voltage (first reference voltage), which is obtained by dividing the constant voltage outputted from the constant-voltage power supply DC (715) with the resistor R9 (707), the resistor R7 (706), and the resistor R6 (712), is applied to the inverting input terminal (a−) of the comparator 701.

Then, when a voltage (first voltage) applied to the non-inverting input terminal of the comparator 701 is higher than a voltage (first reference voltage) inputted to the inverting input terminal, the comparator 701 outputs a signal indicative that the alternate-current voltage outputted from the terminal L of the alternating-current power supply 100 is positive. Specifically, the comparator 701 causes a level of a signal, which is to be outputted from a terminal A, to become one logic level (e.g., Hi), and outputs the signal therefrom, a state of which is represented by the waveform depicted by A in phases I and III of FIG. 4.

Whereas, when a voltage applied to the terminal L of the polarity detection circuit 700 is negative, a negative voltage is applied to the anode of the diode D1 (702), and thus a voltage at the non-inverting input terminal (a+) of the comparator 701 results in substantially zero volts.

At this time, since a voltage applied to the terminal N of the polarity detection circuit 700 is positive, a positive voltage is applied to the anode of the diode D2 (709). Thus, a voltage, which is substantially equal to a voltage outputted from the terminal N of the alternating-current power supply 100, is outputted to the cathode of the diode D2 (709). Therefore, a voltage (first reference voltage) corresponding to a voltage at the cathode of the diode D2 (709) is applied to the inverting input terminal (a−) of the comparator 701. Specifically, a voltage at the cathode of the diode D2 (709) is divided by a circuit including the resistor R2 (710), the resistor R4 (711), the resistor R6 (712), the resistor R7 (706), the resistor R9 (707), and the constant-voltage power supply DC (715), thereby outputting the aforementioned first reference voltage, and the voltage is applied to the inverting input terminal (a−) of the comparator 701.

Then, when a voltage (first reference voltage) applied to the inverting input terminal of the comparator 701 is higher than a voltage (first voltage) applied to the non-inverting input terminal, the comparator 701 outputs a signal indicative that the alternate-current voltage outputted from the terminal L of the alternating-current power supply 100 is negative. Specifically, the comparator 701 causes a level of a signal, which is to be outputted from a terminal A, to become the other logic level (e.g., Lo), and outputs the signal therefrom, a state of which is represented by the waveform depicted by A in phases II and IV of FIG. 4.

While a description has been given hereinabove of the operation when the control signal A is outputted from the comparator 701, the operation when the control signal B is outputted from the comparator 708 is similar thereto.

With the configuration of the polarity detection circuit 1200 according to the present embodiment, it becomes possible not to erroneously output a signal indicative of the polarity.

Descriptions will be given of, for example, the case where lightning, failure of external electric power supply equipment, or the like occurs when the alternate-current voltage outputted from the terminal L of the alternating-current power supply 100 is negative, or the case where the power is turned on in a state where electric charge remains in an X-cap (101) and the voltages on both of the terminal L side and the terminal N side of the alternating-current power supply 100 are greatly increased.

In this case, since the voltage applied to the terminal L of the polarity detection circuit 700 is positive, a voltage corresponding to a voltage at the cathode of the diode D1 (702) is applied to the non-inverting input terminal of the comparator 701.

However, at this time, since a voltage applied to the terminal N of the polarity detection circuit 700 is also positive, a voltage corresponding to a voltage at the cathode of the diode D2 (709) is applied to the inverting input terminal of the comparator 701.

That is, when the alternate-current voltage outputted from the terminal L of the alternating-current power supply 100 is originally negative, even if the first voltage applied to the non-inverting input terminal of the comparator 701 is increased, the first reference voltage applied to the inverting input terminal of the comparator 701 is also increased, and thus the comparator 701 accurately detects that the alternate-current voltage outputted from the terminal L of the alternating-current power supply 100 is negative, and does not erroneously output a signal indicative of the polarity of the alternate-current voltage.

The polarity detection circuit 700 according to the present embodiment is a circuit, in which an AC voltage is used as an input; and the input voltage is half-wave rectified by the diodes D1 (702) and D2 (709), which are respectively connected to the live (L) side and the neutral (N) side, and thereafter is inputted to plus terminals and minus terminals of comparators (comparators). The comparators include two comparators of A (701) and B (708), the comparator A (701) having the plus terminal connected to the R1 (703) which is connected to the L side and the minus terminal connected to the R2 (710) which is connected to the N side via the resistors R7 (706) and R4 (711); the other comparator B (708) having the plus terminal connected to the R2 (710) which is connected to the N side and the minus terminal connected to the R1 (703) which is connected to the L side via the resistors R8 (713) and R3 (704). Further, a circuit configuration is such that voltages at the minus terminals of the two comparators are raised by DC bias.

Accordingly, the polarity detection circuit 700 detects the polarity of AC as to whether the AC input voltage is positive or negative, by outputting from the comparator a signal corresponding to the polarity of an input. Then, in the polarity detection circuit 700, a voltage opposite in phase to that at the plus terminal is lowered in voltage level by the resistor, and is inputted to the minus terminal of the comparator as the reference voltage.

For example, a voltage obtained by rectifying the input voltage having a sine wave with the diodes D1 (702) and D2 (709) is inputted to the plus terminal of the comparator. Further, a voltage having a phase opposite thereto is raised by DC bias via the resistor, resulting in an input of the minus terminal of the comparator. The comparator determines the timing of outputting by two signals of the plus terminal and the minus terminal.

At this time, in an actual electric circuit, a noise reduction circuit configured by combining a capacitor (C), which is referred to as the X-cap (101), and the like, exists in an input unit, and thus, there is a case of turning on in a state where electric charge remains in the C, depending on the timing of turning-off of the input voltage.

If polarity detection is not performed accurately and when turning on in a state where electric charge remains in the C, voltages at the cathodes of the D1 (702) and D2 (709) may be concurrently generated and two comparators may concurrently output signals, depending on the timing of the phase of the input voltage.

However, in the polarity detection circuit 700 according to the present embodiment, a voltage having an opposite phase (on the other side) is inputted to a detection terminal of the comparator, and thus, for example, even if turning on is performed with the N side being positive in a state where positive charge remains on the L side, phase detection is performed with a voltage difference between D1 (702) and D2 (709) and the result is outputted, thereby being able to prevent concurrent outputs of the comparators (701,708).

Furthermore, in order not to concurrently output signals from the comparators A (701) and B (709), it is required to provide no-response time, referred to as dead time, at the moment of switching of the outputs of the comparators A (701) and B (709), however, in the polarity detection circuit 700, DC bias is performed, and the flow obtained by rectifying AC is made gentle in voltage change, and is poured into the minus terminal, thereby being able to extend the adjustment range of the dead time.

As such, in an electrical circuit to which an alternate-current voltage is inputted, it is effective in improvement in efficiency and addition of functional values to detect the polarity of the alternate-current voltage and cause the circuit to perform an operation according to each of the polarities. For example, also in the case where rectification is performed, it is possible to suppress a loss by controlling a switching element of a phase corresponding to the polarity of the alternate-current voltage; and also in the case where a phase of the alternate current is lost due to power failure, it is possible to cope with it by detecting the voltage polarity of the alternate current.

Figure 5:
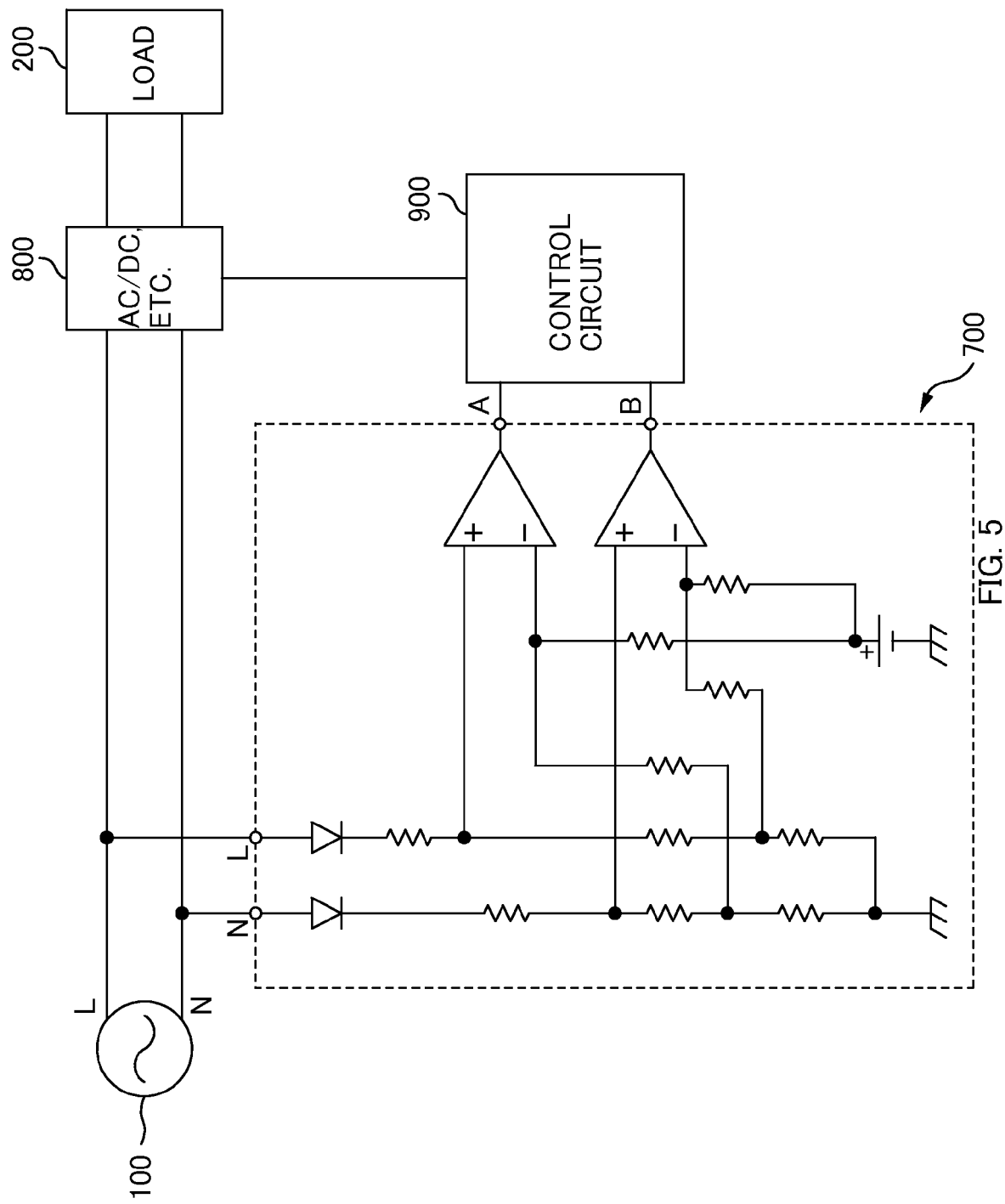
[FIG. 5]
Figure 6:
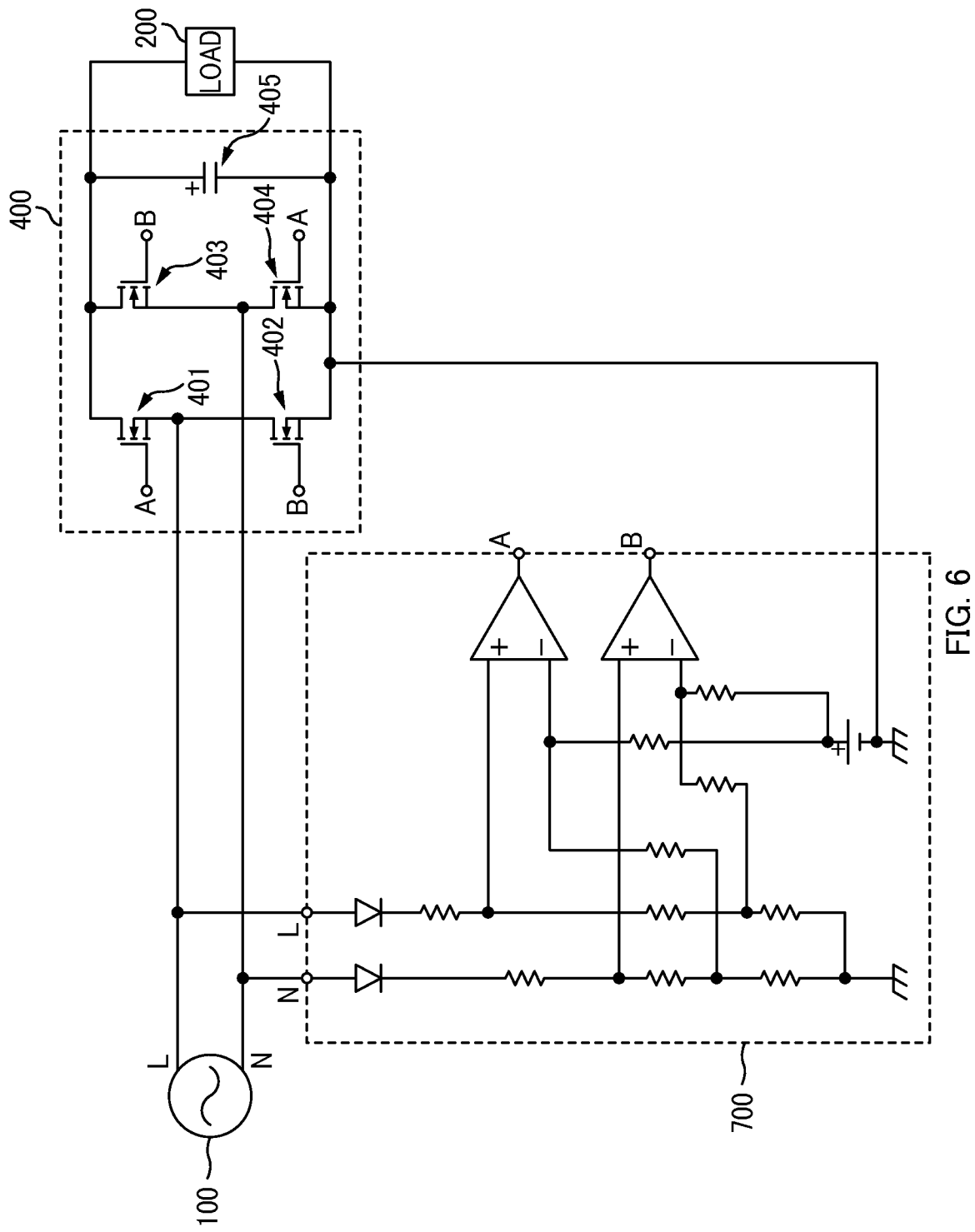
[FIG. 6]
Figure 7:
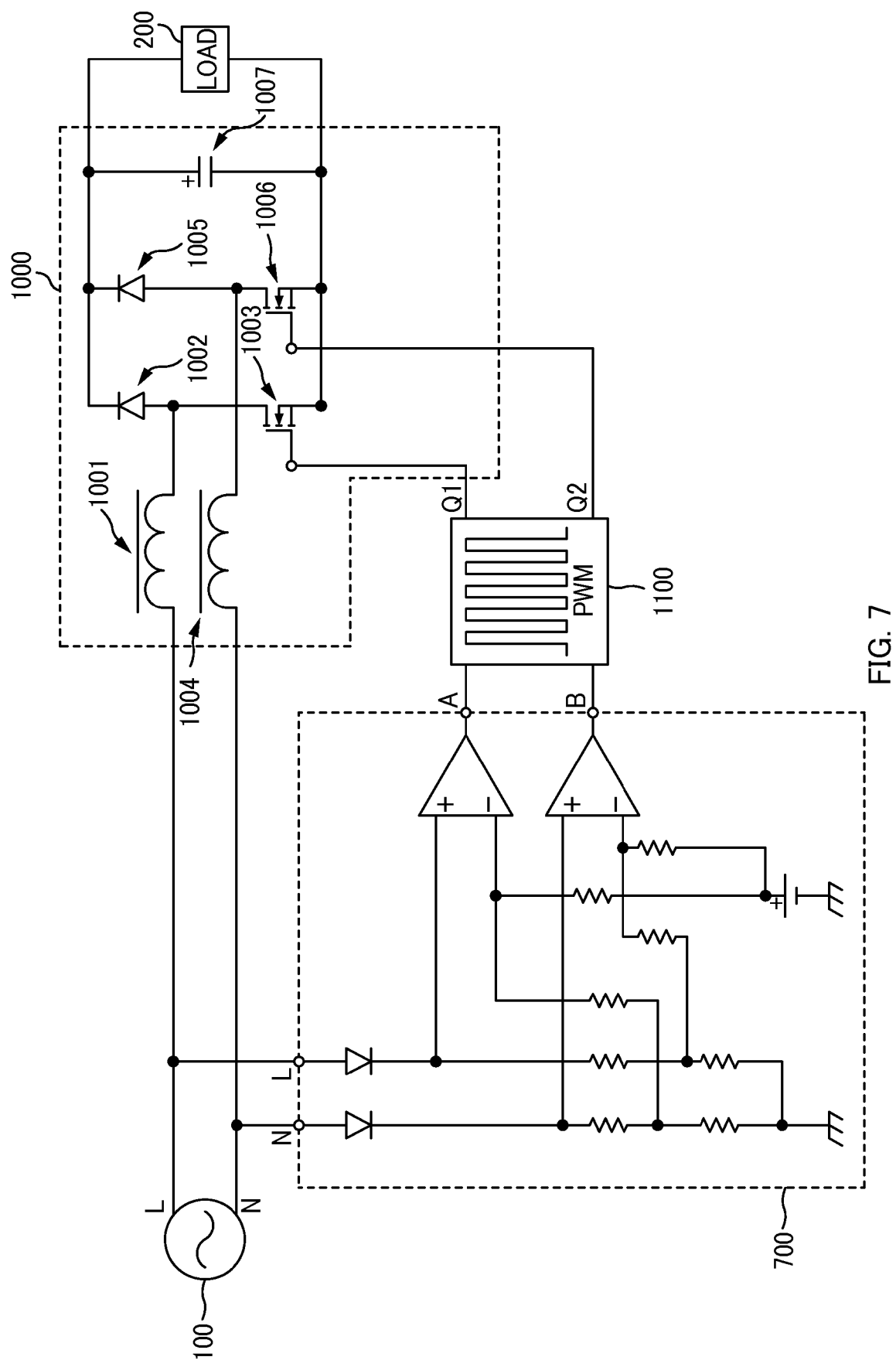
[FIG. 7]
Figure 8:
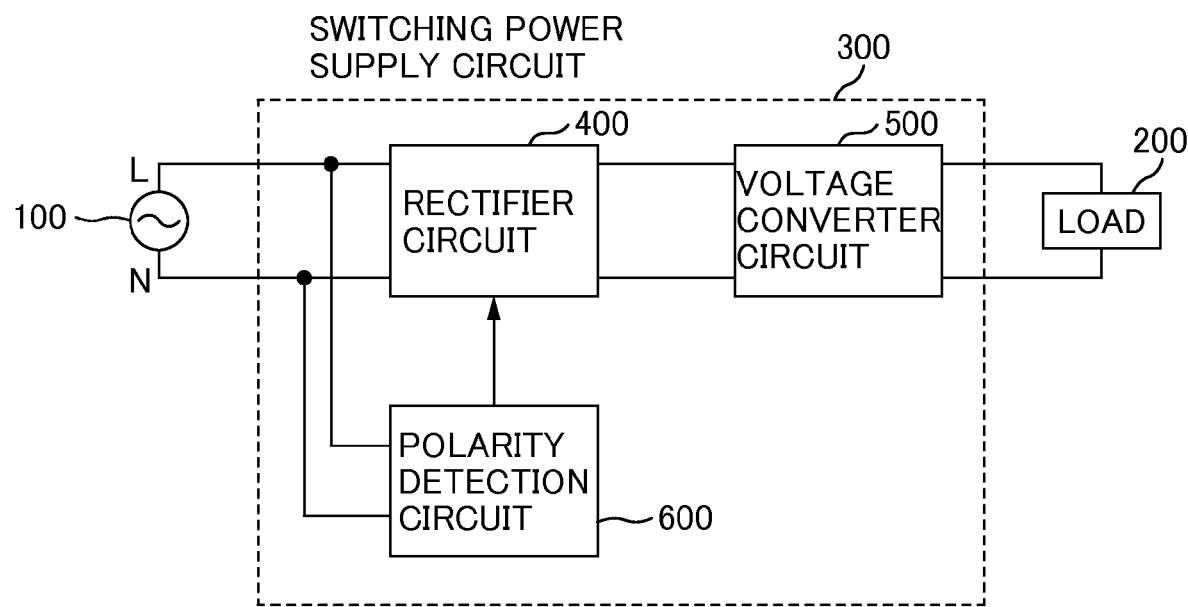
[FIG. 8]

FIGS. 5 to 7 illustrate examples in which the polarity detection circuit 700 according to the present embodiment is used in such various circuits.

A circuit illustrated in FIG. 5 is an example where, in a circuit in which the alternate-current voltage outputted from the alternating-current power supply 100 is converted into a direct current by an AC/DC converter 800, and is supplied to the load 200, the polarity detection circuit 700 detects the polarity of the alternate-current voltage, and inputs signals A and B indicative of the polarity of the alternate-current voltage to a control circuit 900, which causes the control circuit 900 to control the AC/DC converter 800 in accordance with the polarity of the alternate-current voltage.

A circuit illustrated in FIG. 6 is an example where, in a circuit in which the alternate-current voltage outputted from the alternating-current power supply 100 is rectified into a direct current by the synchronous rectifier circuit 400 and is supplied to the load 200, the polarity detection circuit 700 detects the polarity of the alternate-current voltage, and inputs signals A and B indicative of the polarity of the alternate-current voltage to switching elements in the synchronous rectifier circuit 400.

A circuit illustrated in FIG. 7 is an example where the polarity detection circuit 700 is applied to a bridgeless boost circuit 1000 which is configured to convert the alternate-current voltage outputted from the alternating-current power supply 100 into a direct current without using a bridge circuit, as well as raise the voltage to the predetermined voltage corresponding to the load 200.

As described hereinabove, with the polarity detection circuit 700 according to the present embodiment, it becomes possible not to erroneously output a signal indicative of the polarity of the alternate-current voltage, in a polarity detection circuit configured to detect the polarity and output a signal according to the polarity.

Further, with the polarity detection circuit 700 according to the present embodiment, it becomes possible to utilize a low-loss rectifier circuit and reduce the power consumption of the circuit. Furthermore, since not only an input but also an output of the alternate current is detectable, inverter outputs of a motor drive and the like are also detectable.

Hereinabove, the suitable embodiments of the present invention has been described, however, they are examples for explaining the present invention, and are not intended to limit the scope of the present invention to only the present embodiments. The present invention can be implemented in other various embodiments.

REFERENCE SIGNS LIST

100 alternating-current power supply
700 polarity detection circuit 701 comparator
702 diode
708 comparator
709 diode
715 constant-voltage power supply
1200 switching power supply circuit

The invention claimed is:

1. A polarity detection circuit configured to output a signal indicative of polarity of an alternate-current voltage outputted from an alternating-current power supply, the polarity detection circuit comprising:
   a first diode having an anode to which an alternate-current voltage having a first phase is applied, the alternate-current voltage outputted from the alternating-current power supply;
   a second diode having an anode to which an alternate-current voltage having a second phase opposite to the first phase is applied, the alternate-current voltage outputted from the alternating-current power supply;
   a constant-voltage power supply configured to output a positive constant voltage;
   a first reference-voltage output circuit configured to,
      when the alternate-current voltage having the first phase is positive, output a voltage corresponding to the constant voltage, and,
      when the alternate-current voltage having the first phase is negative, output a voltage corresponding to a voltage at a cathode of the second diode; and
   a first signal output circuit configured to
      compare a first voltage corresponding to a voltage at a cathode of the first diode and a voltage outputted from the first reference-voltage output circuit, and
      output a signal indicative of polarity of the alternate-current voltage having the first phase, according to a comparison result.

2. The polarity detection circuit according to claim 1, wherein
   the first signal output circuit is further configured to, when the first voltage is higher than a voltage outputted from the first reference-voltage output circuit, output a signal indicative that the alternate-current voltage having the first phase is positive.

3. The polarity detection circuit according to claim 1, further comprising:
   a second reference-voltage output circuit configured to,
      when the alternate-current voltage having the second phase is positive, output a voltage corresponding to the constant voltage, and,
      when the alternate-current voltage having the second phase is negative, output a voltage corresponding to a voltage at the cathode of the first diode; and
   a second signal output circuit configured to
      compare a second voltage corresponding to a voltage at the cathode of the second diode and a voltage outputted from the second reference-voltage output circuit, and
      output a signal indicative of polarity of the alternate-current voltage having the second phase, according to a comparison result.

4. The polarity detection circuit according to claim 3, wherein
   the first signal output circuit is further configured to, when the first voltage is higher than a voltage outputted from the first reference-voltage output circuit, output a signal indicative that the alternate-current voltage having the first phase is positive, and
   the second signal output circuit is further configured to, when the second voltage is higher than a voltage outputted from the second reference-voltage output circuit, output a signal indicative that the alternate-current voltage having the second phase is positive.

* * * * *